US009172506B2

(12) United States Patent
Polehn et al.

(10) Patent No.: US 9,172,506 B2
(45) Date of Patent: Oct. 27, 2015

(54) PACKET LOSS RECOVERY

(71) Applicant: Cellco Partnership, Arlington, VA (US)

(72) Inventors: Donna L. Polehn, Kirkland, WA (US);
Deepak Kakadia, Union City, CA (US);
Lalit R. Kotecha, San Ramon, CA (US)

(73) Assignees: Cellco Partnership, Basking Ridge, NJ (US); Verizon Patent and Licensing Inc., Basking Ridge, NJ (US)

(*) Notice: Subject to any disclaimer, the term of this patent is extended or adjusted under 35 U.S.C. 154(b) by 249 days.

(21) Appl. No.: 13/795,842

(22) Filed: Mar. 12, 2013

(65) Prior Publication Data
US 2014/0281831 A1 Sep. 18, 2014

(51) Int. Cl.
*H03M 13/00* (2006.01)
*H03M 13/03* (2006.01)
*H04L 1/08* (2006.01)
*H03M 13/23* (2006.01)

(52) U.S. Cl.
CPC *H04L 1/08* (2013.01); *H03M 13/23* (2013.01)

(58) Field of Classification Search
CPC ..... H03M 13/00; H03M 13/23; H03M 13/47; H03M 13/235; H04L 1/08
USPC ......... 714/776, 786, 748–751, 758, 774, 780, 714/52; 370/242, 245, 254
See application file for complete search history.

(56) References Cited

U.S. PATENT DOCUMENTS

| 8,676,573 B2* | 3/2014 | Sun et al. ................. 704/207 |
| 2007/0177719 A1* | 8/2007 | Dei et al. ................. 380/28 |
| 2007/0195905 A1* | 8/2007 | Schatz ................. 375/265 |

* cited by examiner

*Primary Examiner* — Christine Tu

(57) ABSTRACT

A network device includes a network interface device that receives at least a subset of a plurality of recoverable packets. The plurality of recoverable packets corresponds to a plurality of original packets generated by a source device. A processor having a packet recovery module recreates each of the original packets based on the subset of the recoverable packets received. The subset of recoverable packets excludes recoverable packets lost during transmission to the network interface device. A system includes a first network device that generates original packets and converts the original packets to recoverable packets. A second network device receives at least a subset of the recoverable packets, excluding recoverable packets lost during transmission from the first network device. The second network device includes a packet recovery module that recreates the original packets based on the subset of the recoverable packets received at the second network device.

21 Claims, 6 Drawing Sheets

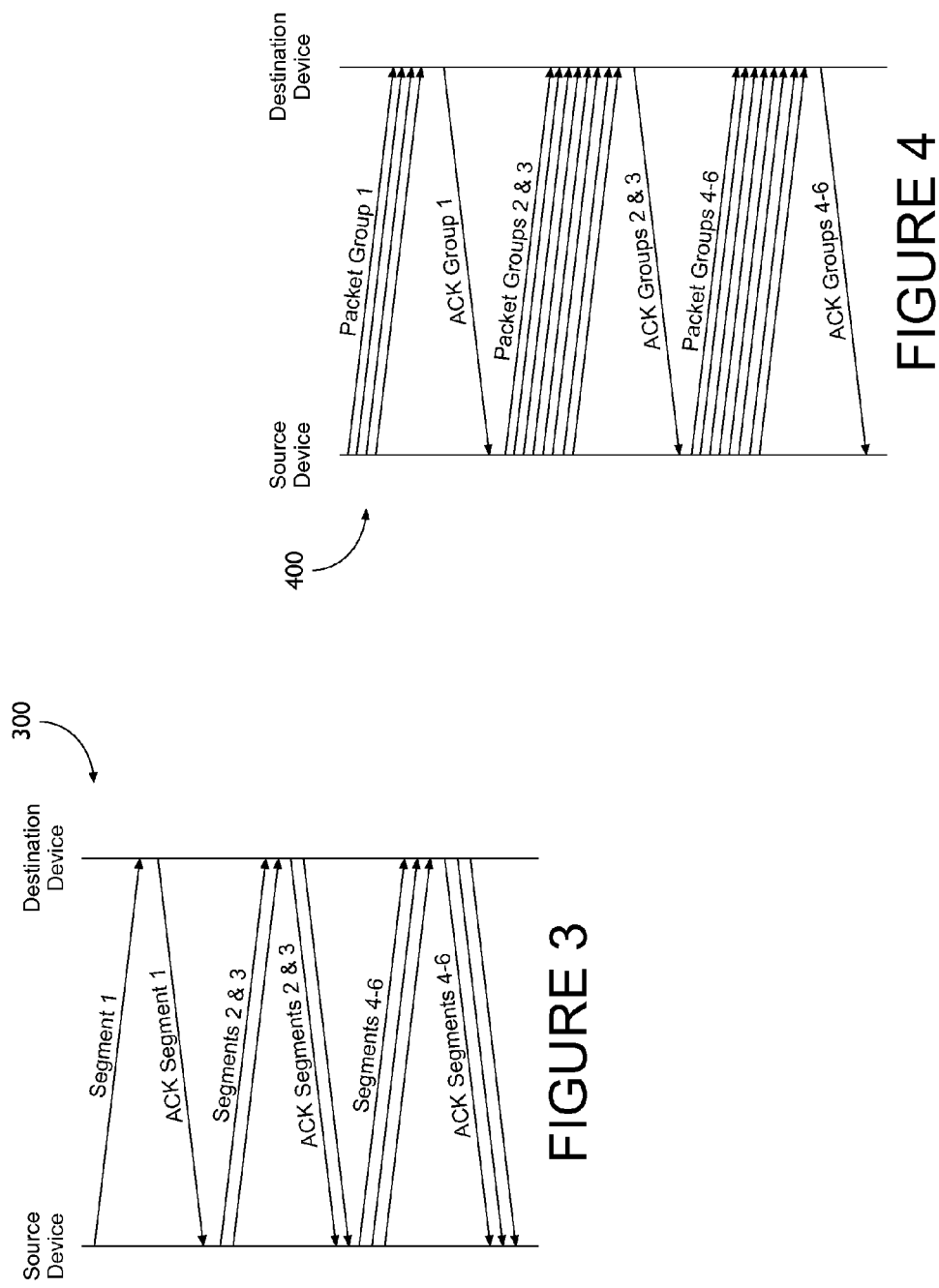

US 9,172,506 B2

PACKET LOSS RECOVERY

BACKGROUND

Different types of networks use dissimilar communication protocols. For example, communication over the Internet, a type of packet-switched network, is in accordance with a set of protocols that includes the Transmission Control Protocol and Internet Protocol (TCP/IP). In contrast, an Ethernet network is a local area network (LAN) in which all computers are connected in a bus or star topology and a collision detection scheme is used to prevent the collision of data between two computing devices that want to send messages at the same time. A cellular communications network uses yet a different type of network schema. Network protocols sometimes prescribe how data is to be communicated over its respective network. For instance, some protocols specify how data should be formatted, addressed, transmitted, routed, and received at the intended destination. Moreover, different types of network-based applications may conform to different protocols. Communications from an email server, for example, may comply with a different protocol than communications transmitted from a web server.

BRIEF DESCRIPTION OF THE DRAWINGS

FIG. 3 is an exemplary ladder diagram illustrating the communication of packets in accordance with a first communication protocol.

FIG. 4 is an exemplary ladder diagram illustrating the communication of packets in accordance with a second communication protocol.

DETAILED DESCRIPTION

An exemplary network device includes a network interface device that receives at least a subset of a plurality of recoverable packets. The plurality of recoverable packets corresponds to a plurality of original packets generated by a source device. A processor having a packet recovery module recreates each of the original packets based on the subset of the recoverable packets received. The subset of recoverable packets excludes recoverable packets lost during transmission to the network interface device. Factors that contribute to lost packets include network congestion and signal interference. Having to request lost packets increases network congestion and may not provide the lost packets if, for example, the interference level is significantly high. Therefore, the network device is able to recreate the lost data without contributing to network congestion by requesting the lost packets be retransmitted or suffering the effects of persistent significant interference.

Figure 1:
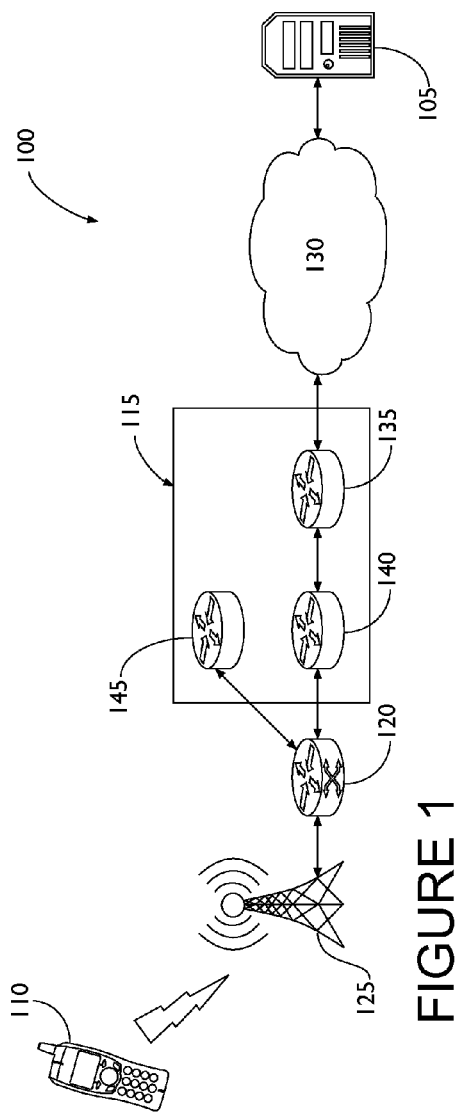
FIG. 1 illustrates an exemplary system for generating and transmitting recoverable packets according to a communication protocol.

FIG. 1 illustrates an exemplary system 100 for transmitting and receiving recoverable packets. The system 100 may take many different forms and include multiple and/or alternate components and facilities. While an exemplary system 100 is shown in the Figures, the exemplary components illustrated in the Figures are not intended to be limiting. Indeed, additional or alternative components and/or implementations may be used.

As illustrated in FIG. 1, the system 100 includes a web server 105, a user device 110, a mobile switching center 115, a switch 120, and a cell site 125.

The web server 105 may include any computing device configured to transmit data over a communication network, which may include a packet-switched network 130 such as the Internet. The web server 105 may be configured to store data associated with one or more applications or web sites. Example applications may include an email application, a calendar application, a word processing application, an online game accessible over the communication network 130, a social networking application, etc. The data stored on the web server 105 may be accessible by request from another computing device, such as the user device 110. For instance, the data stored on the web server 105 may be accessed by, e.g., navigating to a particular website using a web browser, opening a particular application such as an email application, or the like. The web server 105 may store data in a local or remote database (not shown). When a request for data is received, the web server 105 may access the requested information from the database and transmit the requested information over the communication network 130. The web server 105 may be configured to transmit data according to one or more protocols, such as one or more protocols in the Internet Protocol Suite including the Transmission Control Protocol (TCP), Internet Protocol (IP), and User Datagram Protocol (UDP).

The user device 110 may include any computing device configured to allow a user to access data stored on one or more web servers 105. The user device 110 may include a mobile device such as a mobile phone or tablet computer. In other possible implementations, the user device 110 may include a desktop or laptop computer. As shown in the example approach of FIG. 1, the user device 110 includes a mobile device configured to wirelessly send and receive signals over a telecommunications network. The user device 110 may use the telecommunications network to directly or indirectly transmit requests for data to the web server 105. Moreover, the user device 110 may be configured to transmit and receive signals according to one or more communication protocols. Example protocols for communications to and from the user device 110 may include a Transmission Control Protocol (TCP), Internet Protocol (IP), User Datagram Protocol (UDP), or the like.

The mobile switching center 115 may include any number of computing devices configured to facilitate the communication of data between different networks including different types of networks. In one possible approach, the mobile switching center 115 may be configured to transmit requests for data, which as discussed above may be originated at the user device 110, to the web server 105. The request may be received from the user device 110 at the mobile switching center 115 via a telecommunications network while the mobile switching center 115 may route the request to the web server 105 via the communication network 130.

As illustrated in FIG. 1, the mobile switching center 115 includes a packet data network gateway 135 sometimes called a "packet gateway," a serving gateway 140, and a mobility management entity 145. The packet gateway 135 may include one or more network devices configured to implement one or more protocols to transmit and receive data over the communications network. The serving gateway 140 may include any network device configured to process and transfer data received from the packet gateway 135 or from the user device 110. In some exemplary implementations, the serving gateway 140 may act as a mobility anchor during communication handovers and as an anchor for mobility between different types of telecommunication technology such as Long-Term Evolution (LTE) and Third Generation Partnership Project (3GPP) networks. Example network devices that may be used to implement the packet gateway 135, serving gateway 140, or both, may include a gateway, a router, a switch, a firewall, a network interface card, a hub, a bridge, a proxy server, an optical add-drop multiplexer, or another device configured to transfer data over a network. The mobility management entity 145 may include any computing device configured to monitor communications made between the web server 105 and the user device 110. The mobility management entity 145 may be configured to provide control plane functionality for communications between different networks including different types of networks.

The switch 120 may include any network device configured to implement various standards for transmitting data between the user device 110 and the web server 105. For instance, the switch 120 may include Ethernet or Multi-Layer switch 120 configured to facilitate asynchronous transfer mode communications.

The cell site 125 may include various devices configured to facilitate wireless communication with the user device 110. The cell site 125, therefore, may be configured to wirelessly transmit data received from the switch 120 to the user device 110 and receive data wirelessly transmitted from the user device 110. In one possible approach, the cell site 125 may include a network node, such as Evolved Node B (EnodeB), a cellular tower, or both. Data received at the cell site 125 from the switch 120 may be transmitted to the user device 110 while data received at the cell site 125 from the user device 110 may be forwarded to the switch 120.

Various network devices are represented in FIG. 1. For instance, the web server 105, the user device 110, the components of the mobile switching center 115 such as the packet gateway 135 and the serving gateway 140, and the cell site 125 may each include one or more network devices such as the exemplary network device 200 shown in FIG. 2. In general, each network device may be configured to generate and transmit packets over either the packet-switched network 130 or the telecommunications network (e.g., through the cell site 125). One or more of the network devices may be configured to transmit packets according to different protocols. Prior to the transmission of data between different network devices, the network devices may be configured to negotiate the protocol that each network device will use. The negotiation may occur during a handshake or initialization process. In one possible approach, one or more of the network devices may set a flag or populate a particular field that identifies acceptable protocols for the network device.

Figure 2:
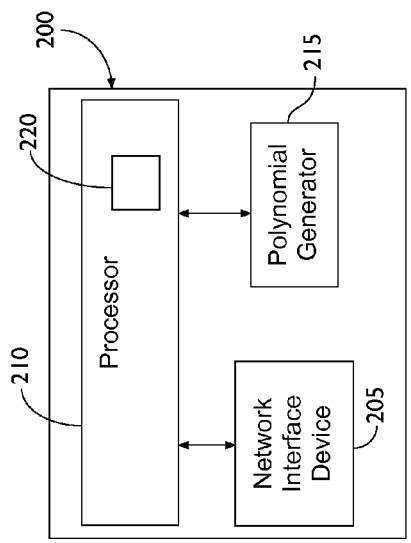
FIG. 2 illustrates exemplary components of a network device in the system of FIG. 1.

FIG. 2 illustrates exemplary components of one or more network devices 200 that may be used in accordance with the above description of FIG. 1. As mentioned above, any one or more of the web server 105, the user device 110, the components of the mobile switching center 115 such as the packet gateway 135 and the serving gateway 140, and the cell site 125 may each include one or more network devices 200.

The network device 200 shown in FIG. 2 includes a network interface device 205, a processor 210, a polynomial generator 215, and a packet recovery module 220.

The network interface device 205 may be configured to facilitate communication with other devices including other network devices 200. The network interface device 205 may be configured to receive signals from and transmit signals to other network devices 200 over one or more communication networks, which may include packet-switched network 130. In some possible approaches, the network interface device 205 may provide the network device 200 with wireless communication, wired communication, or both.

The processor 210 may be configured to process signals received from the network interface device 205. In some instances, the processor 210 may be configured to access data stored in a database (not shown) either locally or remotely relative to the network device 200. Moreover, the processor 210 may be configured to update the database with information received from the network interface device 205. Additionally, the processor 210 may be configured to direct the network interface device 205 to transmit data in the form of packets over one or more communication networks. The processor 210 may be configured to implement one or more modules. For purposes of clarity, only the packet recovery module 220 (discussed below) is shown in FIG. 2. The processor 210 may, however, include additional modules (not shown). Furthermore, although shown as part of the processor 210, the packet recovery module 220 may alternatively be part of a separate computing or processing device (not shown).

The processor 210 may be configured to participate in a handshake or initialization process with an intended destination device prior to transmitting recoverable packets to the intended destination device. The handshake or initialization process may include the processor 210 determining whether the intended destination device is able to receive and process recoverable packets and identifying the intended destination device's preferred protocol for communication. The processor 210 may make such determinations from messages received from the intended destination device during the handshake or initialization process or based on information stored in memory (not shown) of the network device 200 and accessible to the processor 210. Additionally, the processor 210 may be configured to output a signal for transmission to the intended destination device indicating that the network device 200 is able to process recoverable packets.

The polynomial generator 215 may be configured to receive an input of data and output a polynomial that represents the data received. In one possible implementation, the polynomial generator 215 may be configured to receive data from the processor 210 or the packet recovery module 220 as discussed in greater detail below. The polynomial generator 215 may be implemented via hardware, software, or a combination of both. If implemented in hardware, the polynomial generator 215 may include a series of data or delay flip-flops (D flip-flops) that are each configured to receive an input signal and a clock signal. The D flip-flops are also each configured to output a digital signal representative of their respective inputs relative to a clock signal. The output of each D flip-flop changes to represent the input on either the rising or falling edge of the clock signal. Thus, each D flip-flop is configured to hold the input value for at least the length of a clock cycle. When multiple D flip-flops are connected in series, the signals are processed according to a serial-in, serial-out (SISO) arrangement where the output of the first D flip-flop propagates through each subsequent D flip-flop. The output from the last D flip-flop at each clock cycle may be a single bit that may be received at the packet recovery module 220. The serial collection of each output of the last D flip-flop may represent a polynomial string or polynomial code that defines the data or groups of data contained in each packet. In general, the polynomial strings generated may be longer than the groups of data provided to the first D flip-flop. By way of example only, groups of data having three (3) bits (e.g., a triplet) may be provided to the polynomial generator 215, which may include five (5) D flip-flops. The polynomial string may be five (5) bits based on the number of D flip-flops. The two additional bits of the polynomial string may represent redundancy relative to previous triplets received at the input of the polynomial generator 215. The polynomial string, with the extra bits, may be used to encode packets for error correction purposes using the polynomial string for Forward Error Correction (FEC). The output of the polynomial generator 215, therefore, may be considered error correction data used to encode and decode packets. The error correction data may provide sufficient redundancy to encoded packets so that the encoded packets can be recreated if one or more are lost during transmission to the intended destination device. Applying the polynomial string to the data in the packets may add parity bits to data contained in the packets. Parity bits may represent a characteristic of the string of data in each packet, such as whether the number of ones transmitted in the packet is an even number or an odd number. The parity bits may be used to determine whether the entire string of data in the packets was transmitted correctly based on, e.g., whether any bits in the string of data were flipped (i.e., a "one" was transmitted as a "zero" or a "zero" was transmitted as a "one"). Additional or alternative applications of the polynomial string to encode the packets may be in accordance with a Reed-Solomon error correction technique or in accordance with a Viterbi technique.

The length of the polynomial string may be dynamic in some exemplary approaches. For instance, the length of the polynomial string may be based, at least in part, on network conditions such as interference, network congestion, or both. When the network conditions indicate significant congestion or interference, the polynomial string may be lengthened so the error correction data may provide additional redundancy. When the network conditions are less likely to result in missing packets, the polynomial string length may be shortened to provide less redundancy, and thus, more efficient packet transmission. The length of the polynomial string may be determined from one or more calibration values associated with the operation of the polynomial generator 215 and various network conditions such as interference, network congestion, or both. Generally, the length of the polynomial string is equal to or longer than the number of bits in the packet. The polynomial generator 215 may be configured to identify present network conditions and determine the length of the polynomial string accordingly from the calibration values. The polynomial generator 215 may be configured to continually monitor the network conditions and update the length of the polynomial string based on the calibration values if the network conditions change. The polynomial generator 215 may increase the length of the polynomial string as network conditions worsen and decrease the length of the polynomial string as network conditions improve. The processor 210, discussed above, may be configured to output a message for transmission to the intended destination device that identifies the number of redundant bits or length of the polynomial string so that the intended destination device may correctly process the recoverable packet. The message may further identify the packets to which the new polynomial string applies or an instruction for the intended destination device to use the new number of redundant bits or new length until instructed otherwise.

The packet recovery module 220 may be configured to generate recoverable packets and recreate packets lost during communication to the network device 200 based on the recoverable packets received. Packets that would otherwise be transmitted under one protocol, such as the Transmission Control Protocol/Internet Protocol (TCP/IP) may be referred to as "original packets." The packet recovery module 220 may be configured to convert the original packets to recoverable packets under certain circumstances such as if the destination network device 200 is configured to process recoverable packets which may occur if the destination network device 200 also includes a packet recovery module 220. If the destination network device 200 is unable to process recoverable packets, the packet recovery module 220 may be configured to transmit the original packets without converting the original packets to recoverable packets.

To generate recoverable packets, the packet recovery module 220 may be configured to generate an intermediate group of packets. The intermediate packets may be the result of the packet recovery module 220 performing a convolution process on each of the original packets. The convolution process includes extracting a subset of data from one original packet and mixing it with subsets of data from other original packets. Each intermediate packet formed via the convolution process, therefore, may include at least a subset of data previously contained in different original packets. Example intermediate packets are described below and shown in FIGS. 5-7. After the convolution process is performed, the packet recovery module 220 may be configured to encode the intermediate packets in accordance with a polynomial string determined from, e.g., the output of the polynomial generator 215. As discussed above, the polynomial string may add redundancy (e.g., additional bits) relative to the data contained in the original packets. The recoverable packets may be the result of encoding the intermediate packets. Each recoverable packet, therefore, may include at least a subset of data contained in each of the original packets as well as error correction data in accordance with the polynomial string. After the recoverable packets are created, the processor 210 may instruct the network interface device 205 to transmit the recoverable packets to the intended destination device.

The packet recovery module 220 may be further configured to receive recoverable packets from other network devices 200 and recreate the original packets from the recoverable packets received even if some of the recoverable packets are lost during transmission to the network device 200. To recreate the original packets the packet recovery module 220 may be configured to decode the recoverable packets received. Any lost packets may be recreated from the error correction data (e.g., the redundant bits) contained in the received recoverable packets added during the encoding process. The decoded recoverable packets may closely resemble the intermediate packets discussed above (i.e., the convoluted original packets). The packet recovery module 220, therefore, may be configured to perform a deconvolution process on each of the intermediate packets to recreate the original packets. An example of the deconvolution process is described below with reference to FIG. 7. In short, deconvolution is the process of extracting subsets of data contained in each intermediate packet and combining the subsets of data to recreate the original packets as they existed before the convolution took place.

Before generating and transmitting recoverable packets, the packet recovery module 220 may be configured to determine whether the intended destination device is capable of receiving recoverable packets. If so, the packet recovery module 220 may proceed to generate and transmit the recoverable packets as discussed above. If not, the packet recovery module 220 may transmit the original packets.

FIG. 3 is an exemplary ladder diagram 300 illustrating the communication of packets in accordance with a first communication protocol that may be used by the network device 200 to transmit the original packets to the intended destination device. The first communication protocol, therefore, may be used when the intended destination device is unable to process recoverable packets. As shown in FIG. 3, the left side of the ladder diagram represents the source network device sending the original packets or segments and the right side represents the intended destination device. The term "segment" generally refers to a data unit on the Transport Layer while the term "packet" refers to a data unit on the Physical Layer. The following discussion generally applies to both "segments" and "packets." Upon receipt of each segment, the intended destination device may send an acknowledgement signal (ACK) that indicates that the segment was received. If the ACK is not received from the destination device, the source device may retransmit the original packets or segments until an ACK is received or a predetermined number of times before an error notification results. It may be possible for multiple segments to be received before the intended destination device is able to acknowledge receipt of the segment. Nevertheless, under the first communication protocol, the intended destination device may be configured to transmit an acknowledgement signal for each segment received.

FIG. 4 is an exemplary ladder diagram 400 illustrating the communication of packets in accordance with a second communication protocol. The second communication protocol may be used by the network device to transmit recoverable packets to the intended destination device. As shown in FIG. 4, the left side of the ladder diagram represents the source network device sending groups of recoverable packets and the right side represents the intended destination device. Upon receipt of one or more groups of packets, the intended destination device may send an acknowledgement signal (ACK) that indicates that the group or groups were received. One acknowledgement signal may indicate that multiple groups were received. Similar to the above if the ACK is not received from the destination device, the source device may retransmit the groups of recoverable packets until an ACK is received or a predetermined number of times before an error notification results. Alternatively or in addition, the network device may wait for the intended destination to request the missing packets since the intended destination device may be configured to process the recoverable packets to recreate the original packets. The intended destination device may request the missing packets if the intended destination is unable to recreate the original packets from the recoverable packets.

Figure 5:
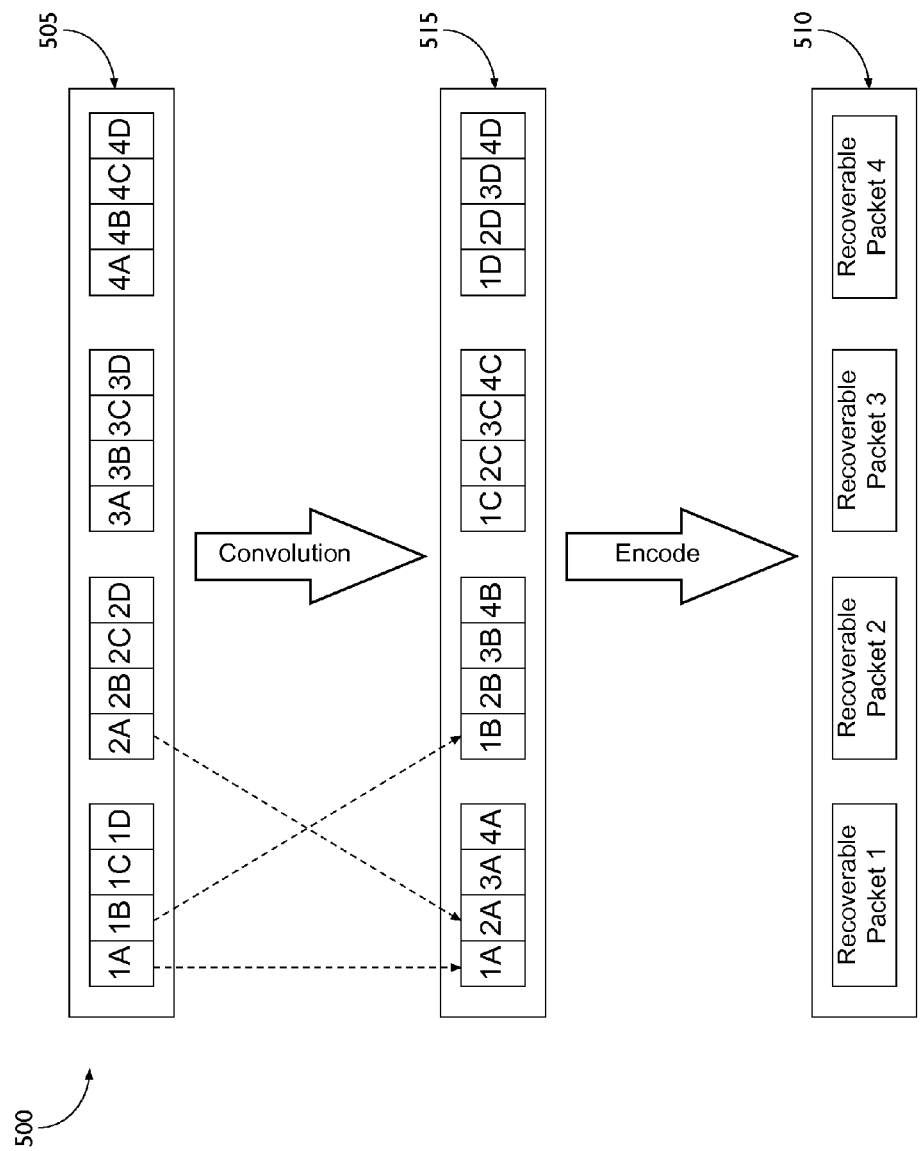
FIG. 5 is an exemplary diagram illustrating the conversion of original packets into recoverable packets.

FIG. 5 is an exemplary diagram 500 illustrating the conversion of original packets 505 into recoverable packets 510. As illustrated, only four original packets 505 are shown for clarity and simplicity, and each original packet 505 includes four data segments (e.g. "1A," "1B," "1C," and "1D"), which is also for clarity and simplicity. The packet recovery module 220 performs the convolution process on the original packets 505 to generate intermediate packets 515. As discussed above, the convolution process includes extracting a subset of data from each original packet 505 and combining the subsets of data from different original packets 505 into each intermediate packet 515. Thus, each intermediate packet 515 includes at least one data segment from each of the original packets 505. For instance, the first intermediate packet 515 includes the following data segments: "1A," "2A," "3A," and "4A" while the second intermediate packet 515 includes the following data segments: "1B," "2B," "3B," and "4B." In one possible implementation, each intermediate packet need not include data from each original packet provided that the data from each original packet is sufficiently represented by enough recoverable packets that the original packet can still be recreated if multiple recoverable packets are lost during transmission.

The intermediate packets 515 are encoded according to a polynomial string, with the redundant bits described above, generated by the polynomial generator 215 to generate the recoverable packets 510. Each recoverable packet 510, therefore, includes at least a subset of data from each original packet 505 as well as error correction data that may be used to recreate the original packets 505. The recoverable packets 510 may be transmitted according to the second communication protocol discussed above with respect to FIG. 4.

Figure 6:
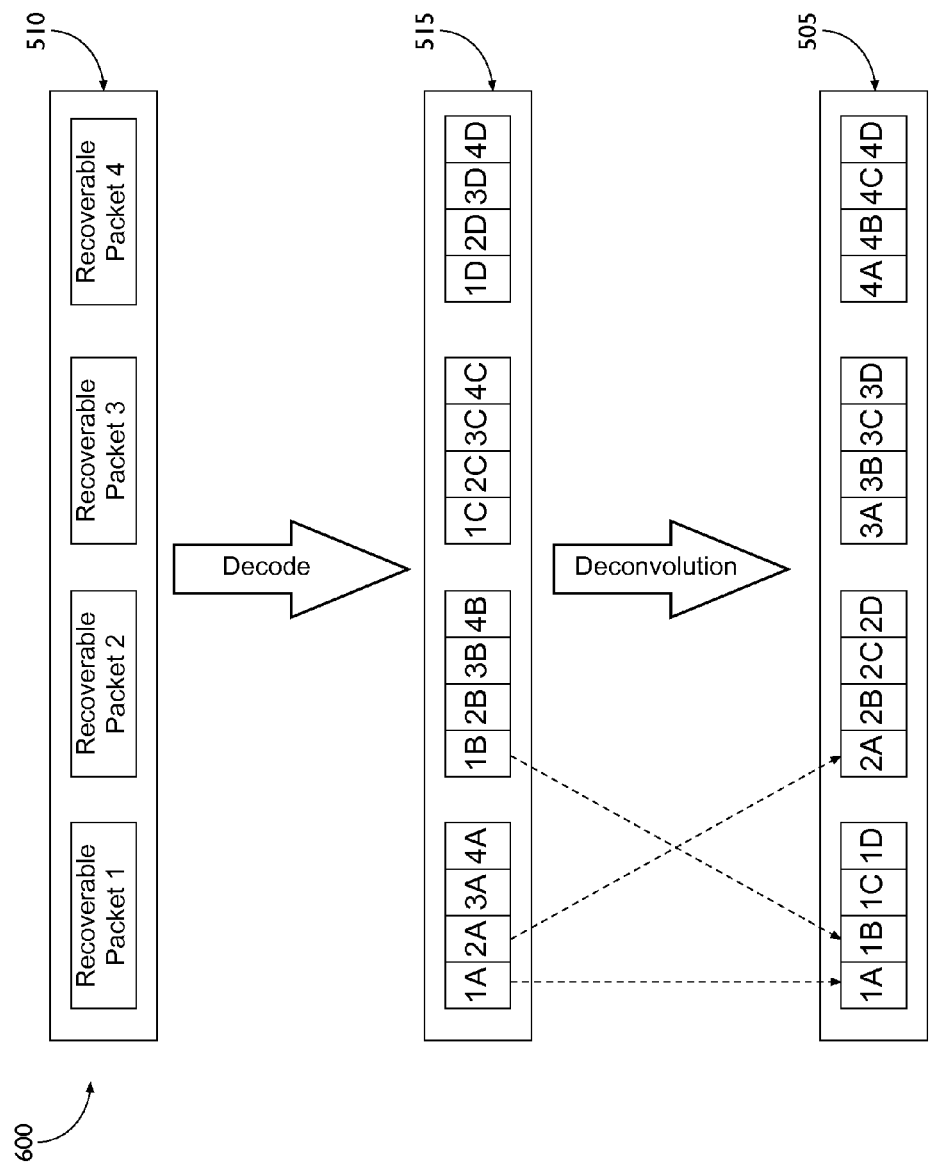
FIG. 6 is an exemplary diagram illustrating the conversion of the recoverable packets into the original packets.

FIG. 6 is an exemplary diagram 600 illustrating the conversion of the recoverable packets 510 into the original packets 505. The recoverable packets 510 are decoded in accordance with the error correction data, which as discussed above is based at least in part on a polynomial string generated by the polynomial string generator. The result of decoding the recoverable packets 510 is a string of intermediate packets 515 that include at least a subset of data from each of the original packets 505. The packet recovery module 220 may perform a deconvolution technique to recreate the original packets 505 from the intermediate packets 515.

Figure 7:
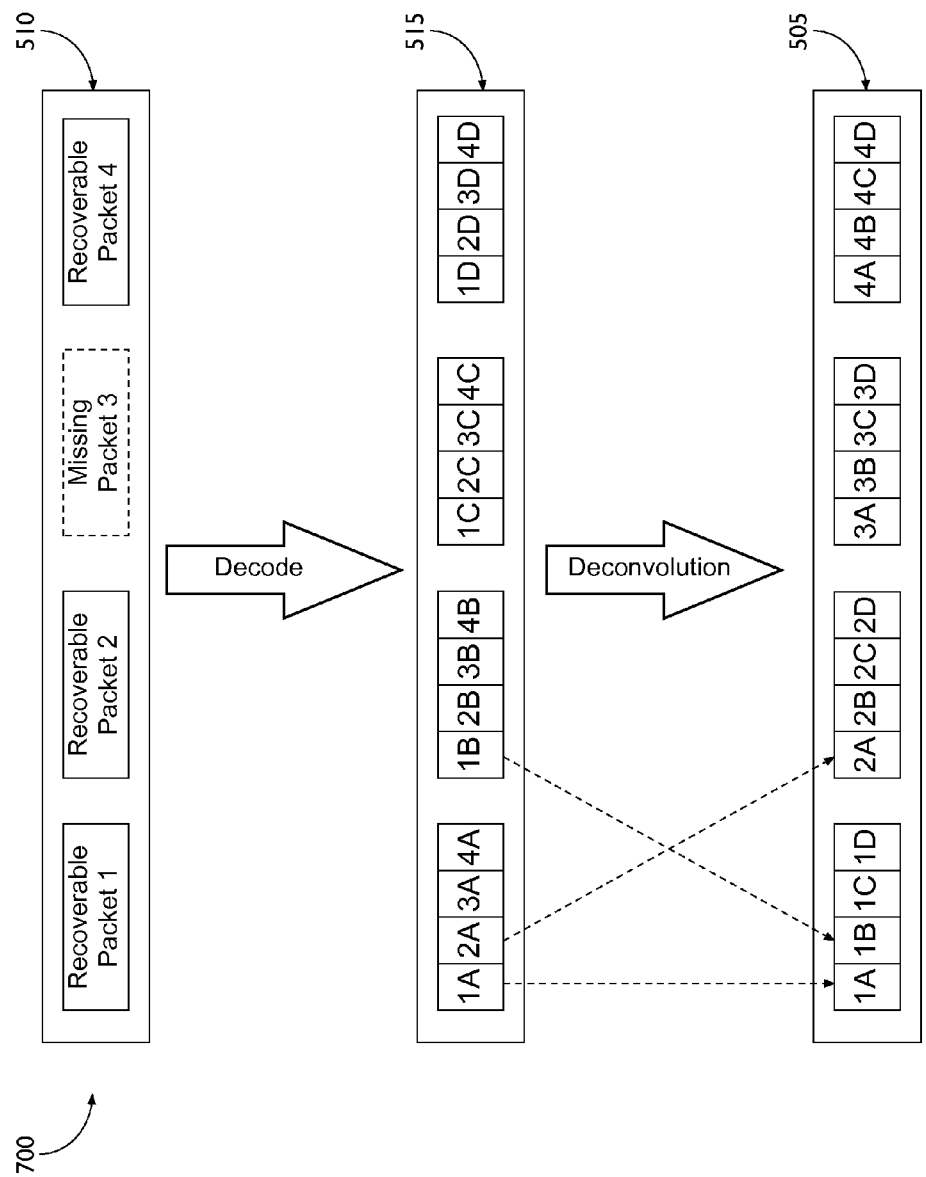
FIG. 7 is an exemplary diagram illustrating the conversion of a subset of the recoverable packets into the original packets.

FIG. 7 is an exemplary diagram 700 illustrating the conversion of a subset of the recoverable packets 510 into the original packets 505. If one or more recoverable packets 510 are lost during transmission to the network device 200, the packet recovery module 220 may be configured to recreate each original packet 505 based on the error correction data (e.g., redundant bits) stored in the subset of recoverable packets 510 received at the network device 200. In the example shown in FIG. 7, one recoverable packet 510, e.g., "Recoverable Packet 3" from FIG. 6, was lost during transmission (represented as "Missing Packet 3" in FIG. 7). The packet recovery module 220 may be configured to decode the received recoverable packets 510, and using the error correction data stored in the received recoverable packets 510, recreate each of the intermediate packets 515. The packet recovery module 220 may perform a deconvolution technique on the intermediate packets 515 to recreate each of the original packets 505 even though at least one of the recoverable packets 510 was lost during transmission.

In general, computing systems and/or devices, such as the web server 105, the user device 110, the mobile switching center 115, the switch 120, and the cell site 125, may employ any of a number of computer operating systems, including, but by no means limited to, versions and/or varieties of the Microsoft Windows® operating system, the Unix operating system (e.g., the Solaris® operating system distributed by Oracle Corporation of Redwood Shores, Calif.), the AIX UNIX operating system distributed by International Business Machines of Armonk, N.Y., the Linux operating system, the Mac OS X and iOS operating systems distributed by Apple Inc. of Cupertino, Calif., the BlackBerry OS distributed by Research In Motion of Waterloo, Canada, and the Android operating system developed by the Open Handset Alliance. Examples of computing devices include, without limitation, a computer workstation, a server, a desktop, notebook, laptop, or handheld computer, or some other computing system and/or device.

Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

Figure 8:
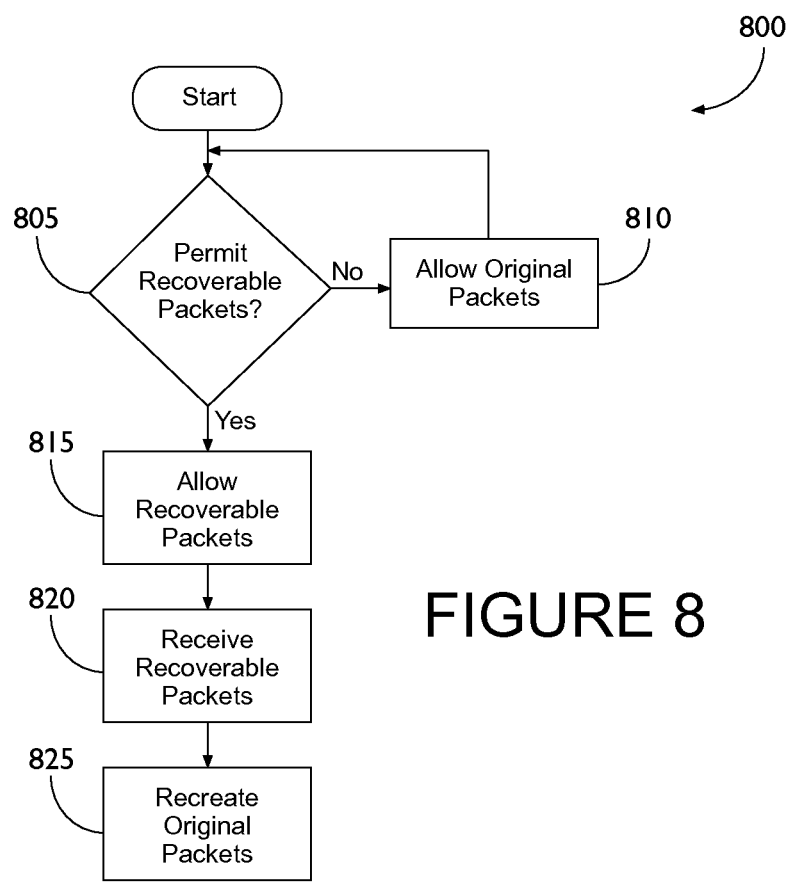
FIG. 8 is a flowchart of an exemplary process that may be implemented by one or more network devices shown in FIG. 1.

FIG. 8 illustrates an exemplary process 800 that may be implemented by, e.g., the packet recovery module 220 of the network device 200 to create and process recoverable packets 510.

At decision block 805, the packet recovery module 220 may determine whether to permit recoverable packets 510 based on, e.g., whether the network device 200 is able to process recoverable packets 510. The packet recovery module 220 may determine whether the network device 200 can process recoverable packets 510 if the network device 200 is able to receive and process packets in accordance with the protocol under which the recoverable packets 510 are created, transmitted, and decoded. Examples of such protocols were discussed above. If the network device 200 is not capable of receiving recoverable packets 510, the process 800 may continue at block 810. If the network device 200 is capable of receiving recoverable packets 510, the process 800 may continue at block 815.

At block 810, the packet recovery module 220 may prohibit receipt of the recoverable packets 510 at the network device 200 and instead allow receipt of the original packets 505 or packets processed according to a different protocol. The network device 200 may receive the original packets 505 or a subset of original packets 505 (i.e., original packets 505 that are not lost during transmission to the network device 200).

At block 815, the packet recovery module 220 may allow the receipt of recoverable packets 510. For instance, the packet recovery module 220 may set a flag or populate a particular field that identifies to other devices that the network device 200 is able to receive recoverable packets 510 and that communication with the network device 200 should proceed according to the protocols discussed above.

At block 820, the packet recovery module 220 may receive at least a subset of the recoverable packets 510. The recoverable packets 510 may be received at the network device 200 by the network interface module. As discussed above, the recoverable packets 510 may be generated by performing a convolution process on the original packets 505 to generate intermediate packets 515 and encoding the intermediate packets 515 with error correction data based on a polynomial string. The network device 200 that created the recoverable packets 510 may transmit the recoverable packets 510 to the intended destination device. The network interface device 205 of the intended destination device may pass the received recoverable packets 510 to the processor 210, and in particular, the packet recovery module 220 of the intended destination device.

At block 825, the packet recovery module 220 may recreate the original packets 505 from the recoverable packets 510 received. The packet recovery module 220 may decode the recoverable packets 510 according to error correction data to generate the intermediate packets 515. If any recoverable packets 510 were lost during transmission, the packet recovery module 220 may still generate data contained in the missing recoverable packets 510 based on the error correction data contained in the recoverable packets 510 that were received due, in part, to the redundancy added by the error correction data. The packet recovery module 220 may perform a deconvolution process on the intermediate packets 515 to recreate the original packets 505.

With the process 800, the network device 200 is able to receive the data in the missing recoverable packets 510 without contributing to additional network congestion or suffering the effects of significant interference.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description.

The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A network device comprising:
   a network interface device configured to receive at least a subset of a plurality of recoverable packets, wherein the plurality of recoverable packets correspond to a plurality of original packets generated by a source device; and
   a processor having a packet recovery module configured to recreate each of the original packets based on the subset of the recoverable packets received, wherein the subset of recoverable packets excludes recoverable packets lost during transmission to the network interface device;
   wherein the network device is further configured to receive a signal representing a length of at least one polynomial string according to which a plurality of intermediate packets with error correction data are encoded prior to receiving the at least a subset of a plurality of recoverable packets, the intermediate packets being generated from the original packets by the source device.

2. The network device of claim 1, wherein the packet recovery module is configured to recreate each of the original packets by decoding each recoverable packet in the subset of recoverable packets based at least in part on a deconvolution process and error correction technique.

3. The network device of claim 1, wherein the packet recovery module is configured to generate recoverable packets for the network interface device to transmit.

4. The network device of claim 1, wherein each recoverable packet includes at least a subset of data contained in at least two of the plurality of original packets.

5. The network device of claim 1, wherein the processor is configured to output a signal indicating that the processor is configured to process the recoverable packets, and wherein the network interface device is configured to transmit the signal to the source device prior to the source device transmitting the recoverable packets.

6. The network device of claim 1, wherein the processor is configured to determine whether the source device is configured to process recoverable packets, and wherein the packet recovery module is configured to generate recoverable packets to transmit to the source device if the source device is configured to process recoverable packets.

7. A system comprising:
   a first network device configured to generate a plurality of original packets, wherein the first network device is configured to convert the plurality of original packets to recoverable packets by:
     performing a convolution process on each of the plurality of original packets to generate intermediate packets;
     generating at least one polynomial string using a series of D flip-flops having a serial-in, serial-out configuration; and
     encoding the intermediate packets with error correction data according to the at least one polynomial string; and
   a second network device configured to receive at least a subset of the recoverable packets, wherein the subset of the recoverable packets excludes recoverable packets lost during transmission from the first network device to the second network device, and wherein the second network device includes a packet recovery module configured to recreate each of the original packets based on the subset of the recoverable packets received at the second network device;
   wherein each recoverable packet includes at least a subset of data contained in at least one of the original packets and error correction data.

8. The system of claim 7, wherein the first network device is configured to transmit a signal representing a length of the polynomial string to the second network device prior to transmitting the recoverable packets to the second network device.

9. The system of claim 7, wherein the first network device is configured to identify a network condition and adjust a length of the polynomial string based at least in part on the network condition.

10. The system of claim 7, wherein the packet recovery module is configured to recreate each of the original packets by decoding each recoverable packet in the subset of recoverable packets based at least in part on a deconvolution process and error correction technique.

11. The system of claim 7, wherein the second network device is configured to generate recoverable packets for the second network device to transmit to the first network device.

12. The system of claim 7, wherein each recoverable packet includes at least a subset of data contained in at least two of the plurality of original packets.

13. The system of claim 7, wherein the first network device is configured to determine whether the second network device is able to receive recoverable packets prior to the first network device transmitting recoverable packets to the second network device.

14. A non-transitory computer-readable medium tangibly embodying computer-executable instructions comprising instructions that when executed by a processor cause the processor to:
   receive at least a subset of a plurality of recoverable packets, wherein the plurality of recoverable packets corresponds to a plurality of original packets generated by a source device, wherein each recoverable packet includes at least a subset of data contained within at least two of the plurality of original packets; and receive a signal representing a length of at least one polynomial string according to which a plurality of intermediate packets with error correction data are encoded prior to receiving the at least a subset of a plurality of recoverable packets, wherein the intermediate packets are generated from the original packets by the source device;

recreate each of the original packets based on the subset of the recoverable packets received, wherein the subset of recoverable packets excludes recoverable packets lost during transmission.

15. The computer-readable medium of claim 14, wherein each of the original packets is recreated by decoding each recoverable packet in the subset of recoverable packets based at least in part on a deconvolution process and error correction technique.

16. The computer-readable medium of claim 14, the instructions further causing the processor to generate recoverable packets for a network device to transmit.

17. The computer-readable medium of claim 14, the instructions further causing the processor to:
   output a signal indicating that the processor is configured to process the recoverable packets; and
   determine whether a source device is configured to process recoverable packets.

18. A method comprising:
   receiving, at a network device, a signal representing a length of at least one polynomial string according to which a plurality of intermediate packets with error correction data are encoded, the intermediate packets being generated from a plurality of original packets by a source device;
   receiving, at the network device, at least a subset of a plurality of recoverable packets from the source device, the plurality of recoverable packets corresponding to the plurality of original packets generated by the source device, each recoverable packet including at least a subset of data contained within each of the plurality of original packets; and
   recreating each of the original packets based on the subset of the recoverable packets received, the subset of recoverable packets excluding recoverable packets lost during transmission to the network device.

19. The method of claim 18, wherein recreating each of the original packets includes decoding each recoverable packet in the subset of recoverable packets based at least in part on a deconvolution process and error correction technique.

20. The method of claim 18, further comprising:
   outputting a signal indicating that the network device is configured to process the recoverable packets; and
   determining whether the source device is configured to process the recoverable packets.

21. A system comprising:
   a first network device configured to generate a plurality of original packets, wherein the first network device is configured to convert the plurality of original packets to recoverable packets by:
      performing a convolution process on each of the plurality of original packets to generate intermediate packets; and
      encoding the intermediate packets with error correction data according to at least one polynomial string; and
   a second network device configured to receive at least a subset of the recoverable packets, wherein the subset of the recoverable packets excludes recoverable packets lost during transmission from the first network device to the second network device, and wherein the second network device includes a packet recovery module configured to recreate each of the original packets based on the subset of the recoverable packets received at the second network device;
   wherein each recoverable packet includes at least a subset of data contained in at least one of the original packets and error correction data, and
   wherein the first network device is configured to identify a network condition and adjust a length of the polynomial string based at least in part on the network condition.

* * * * *